United States Patent
So et al.

[19]

[11] Patent Number: 5,923,065
[45] Date of Patent: *Jul. 13, 1999

[54] POWER MOSFET DEVICE MANUFACTURED WITH SIMPLIFIED FABRICATION PROCESSES TO ACHIEVE IMPROVED RUGGEDNESS AND PRODUCT COST SAVINGS

[75] Inventors: Koon Chong So; Danny Chi Nim, both of San Jose; True-Lon Lin, Cupertino; Fwu-Iuan Hshieh, Saratoga; Yan Man Tsui, Union City, all of Calif.

[73] Assignee: MegaMOS Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/661,952

[22] Filed: Jun. 12, 1996

[51] Int. Cl.$^6$ ............................................ H01L 29/76
[52] U.S. Cl. .......................... 257/328; 257/329; 257/341; 257/342; 257/346
[58] Field of Search .................... 257/327, 328, 257/329, 335, 341, 342, 346

[56] References Cited

U.S. PATENT DOCUMENTS 4,837,606  6/1989  Goodman et al. ...................... 257/341

Primary Examiner—Minh Loan Tran
Attorney, Agent, or Firm—Bo-In Lin

[57] ABSTRACT

This invention discloses a MOSFET device in a semiconductor chip with a top surface and a bottom surface. The MOSFET device includes a drain region, doped with impurities of a first conductivity type, formed in the semiconductor chip near the bottom surface. The MOSFET device further includes a vertical pn-junction region, which includes a lower-outer body region, doped with impurities of a second conductivity type, formed on top of the drain region. The pn-junction region further includes a source region, doped with impurities of the first conductivity type, formed on top of the lower-outer body region wherein the lower-outer body region defining a channel region extending from the source region to the drain region near the top surface. The MOSFET device further includes a gate formed on top of the channel region on the top surface. The gate includes a thin insulative bottom layer for insulating from the channel region. The gate is provided for applying a voltage thereon for controlling a current flowing from the source region to the drain region via the channel region. The MOSFET device further includes a deep heavily doped body-dopant region disposed immediately below the source region in the lower-outer body region. It is implanted with a higher concentration of dopant than the lower-outer body region whereby a device ruggedness of the MOSFET device is improved. The deep heavily-doped body-dopant region having a body-dopant concentration profile defined by a diffusion of the body-dopant from an implant depth about twice as that of a source implant-depth whereby the deep heavily-doped body dopant region is kept at a distance away from the channel region.

6 Claims, 10 Drawing Sheets process with double implanted n/n+ -emitter

POWER MOSFET DEVICE MANUFACTURED WITH SIMPLIFIED FABRICATION PROCESSES TO ACHIEVE IMPROVED RUGGEDNESS AND PRODUCT COST SAVINGS

BACKGROUND OF THE INVENTION

1. Field of the Invention

This invention relates generally to the structure and fabrication process of power MOSFETs. More particularly, this invention relates to a novel and improved structure and simplified and low-cost process for fabricating a power MOSFET device provided with heavily doped p+ regions buried underneath the n+ doped source regions to reduce the drain-to-source resistance $R_{ds}$ for preventing an incidental turning on of the parasitic NPN bipolar such that the device ruggedness is improved.

2. Description of the Prior Art

Various internal parasitic components often impose design and performance limitations on a conventional power metal oxide silicon field effect transistor (MOSFET) structure and processing steps of fabrication for manufacturing a MOSFET transistor. Among these parasitic components, special care must be taken in dealing with a parasitic npn bipolar junction transistor (BJT) formed between the source, the body, and the drain. Under static conditions the base and emitter of the parasitic BJT are shorted, leaving only the body-drain diode effective. However, under a transient conditions and in avalanche breakdown, the parasitic BJT may be incidentally activated which can seriously degrade the overall performance of the MOSFET. Under the circumstances when the parasitic bipolar junction transistor is incidentally activated, snap back may occur which can cause permanent damages to the device. For this reason, precaution must be taken to increase the ruggedness of the device by taking into account that an incidental activation of the parasitic BJT should be prevented in an avalanche breakdown condition when large amount of hole current is generated in the core cell area.

In order to better understand the design issues related to device ruggedness encountered in the prior art, general descriptions for the structure of a conventional power MOSFET device and design issues relating to device ruggedness are first discussed. FIG. 1 shows a typical vertical double diffused MOS (VDMOS) device which uses a double diffusion technique to control the channel length 1. Two successive diffusions are performed with first a p diffusion using boron, then a n diffusion using either arsenic or phosphorus, to produce two closely spaced pn junctions at different depths below the silicon surface. With this pn junction, as shown in FIG. 1, the VDMOS supports the drain voltage vertically in the n– epilayer. The current flows laterally from the source through the channel, parallel to the surface of the silicon. The current flow then turns through a right angle to flow vertically down through the drain epilayer to the substrate and to the drain contact. The p-type "body" region in which the channel is formed when a sufficient positive voltage is applied to the gate, the channel length can be controlled through the processing steps. Because of the relative doping concentrations in the diffused p-channel region and the n– layer, the depletion layer which supports $V_{DS}$, a drain to source voltage, extends down into the epilayer rather than laterally into the channel. Under the circumstances of avanlanche breakdown, a hole current, i.e., $I_h$ as shown in FIG. 1, is generated to flow from the breakdown region to the source. A voltage drop, $I_h R_b$, is generated over the parasitic NPN bipolar junction transitior as the hole current $I_h$ is transmitted via the p-body region which has a p-body resistance $R_b$. When this voltage drop across this parasitic bipolar junction transistor reaches a certain level, the parasitic bipolar transistor is turned on. Activation of the parasitic bipolar transistor, as discussed above, could cause snap-back and permanent damages to the MOSFET device.

For the purpose of improving the device ruggedness, Motorola discloses a HDTMOS-2 structure as that shown in FIG. 2 (please refer to Electronic Engineering Times, Apr. 8, 1996, Page 78). After n+ source impant, a dielectric layer is grown on top of the polysilicon gate. The dielectric layer is applied as a spacer for boron implant blocks, automatically self aligned with the source regions. This heavily doped p+ region underneath the source region can reduced the drain to source resistance $R_b$ in the p-body region thus decreasing the voltage drop $I_h R_b$ whereby the ruggedness of the MOSFET device is improved.

In a paper published by Laska et al. entitled "A Low Loss/Highly Rugged IGBT-Generation-Based on a Self Aligned Process with Double Implanted N/N+ Emitter" (Proc. of the 6th Internat. Symposium on Power Semiconductor Device & IC's, Davos, Switzerland May 31–Jun. 2, 1994, PP 171–172), a new V-IGBT chip is disclosed. In order to realize a cell design for low on-state voltage in combination with high ruggedness, special cell structure is implemented. The cell structure is manufactured by applying the steps that after an isotropic etching of the polysilicon gate and after the p-well diffusion a first implant is carried out with one special part, e.g., n-implant, of the total emitter dose. Then an oxide spacer of a width of approximately 0.5 $\mu$m is produced. Using this oxide spacer, a self aligned implant of the highly doped p+ well extremely close to the beginning of the channel is carried out. Then the second emitter implant, e.g., n-implant, follows using the same oxide spacer. Thus the emitter is formed with a double implant. In the critical area near the source contact, without the p+ doping, the parasitic emitter efficiency is adjusted by a low implant dose. Inside the less critical area in the body, the high dose is present which is necessary for the ohmic-Si/metal contact where the parasitic emitter efficiency is reduced by the p+ well. Laska et al. disclose a structure and fabrication method to increase device ruggedness by the use of oxide spacer as that shown in FIG. 3. Such fabrication processes requires more processing steps. The product reliability may be adversely affected by the more complicate fabrication processes and the costs of device production are also increased due to the requirement of applying the spacer.

Therefore, there is still a need in the art of power device fabrication, particularly for power MOSFET design and fabrication, to provide a structure and fabrication process that would resolve these limitations.

SUMMARY OF THE PRESENT INVENTION

It is therefore an object of the present invention to provide an improved MOSFET fabrication process and cell structure to overcome the aforementioned difficulties and limitations encountered in the prior art.

Specifically, it is an object of the present invention to provide an improved MOSFET fabrication process and cell structure wherein a deep heavily doped body region is formed underneath the source regions for device ruggedness improvement without requiring the use of a spacer such that the fabrication processes are simplified.

Another object of the present invention is to provide an improved MOSFET fabrication process and cell structure wherein a deep heavily doped body region is formed underneath the source regions for device ruggedness improvement without requiring the use of a spacer such that the cost savings for device production are achieved.

Briefly, in a preferred embodiment, the present invention discloses an improved method for fabricating a MOSFET transistor on a substrate to improve a device ruggedness. The method includes the steps of: (a) forming an epi-layer of a first conductivity type as a drain region on the substrate and then growing an initial oxide layer over the epi-layer; (b) applying an active layer for etching the initial oxide layer to define an active area and forming a gate oxide layer thereon followed by depositing an overlaying polysilicon layer; (c) applying a poly mask for etching the polysilicon layer to define a plurality of poly gates; (d) removing the poly mask and then carrying out a body implant of a second conductivity type followed by performing a body diffusion for forming a plurality of body regions and for growing a spacing oxide layer overlaying tile ploy gates; (e) implanting high energy body-dopants of the second conductivity type to form a deep heavily-doped body-dopant region in each of the body regions followed by etching the spacing oxide layer and applying a source blocking mask for implanting a plurality of source regions in the body regions with ions of the first conductivity type followed by removing the source blocking mask; and (f) forming in insulation layer and applying a high temperature process for densification of the insulation layer and further for actuating a diffusion of the source regions and the deep heavily-doped body-dopant regions wherein the deep heavily-doped body-dopant regions are formed immediately below the source regions whereby the device ruggedness is improved.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
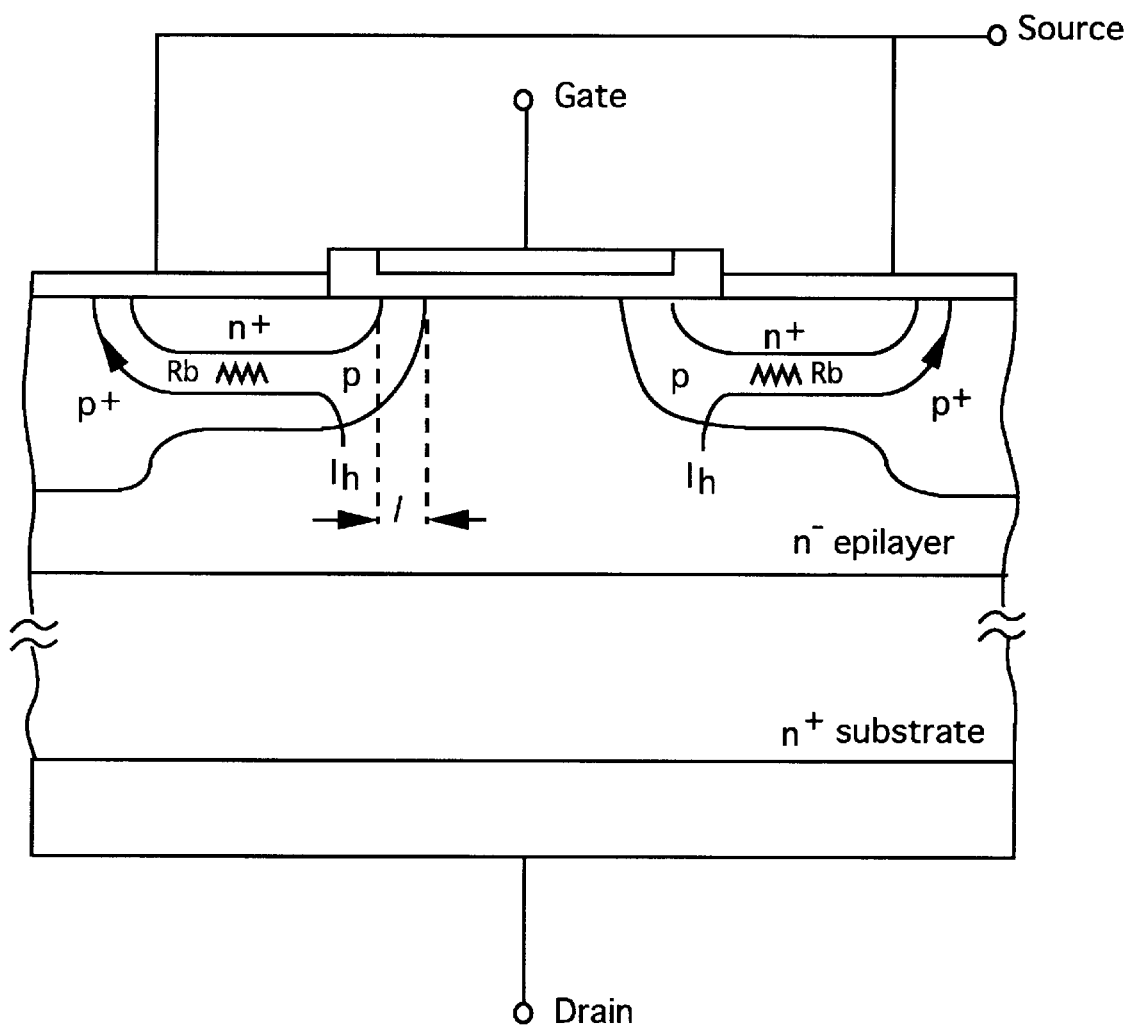
FIG. 1 is a cross-sectional view of a prior art structure of a general MOSFET.
Figure 2:
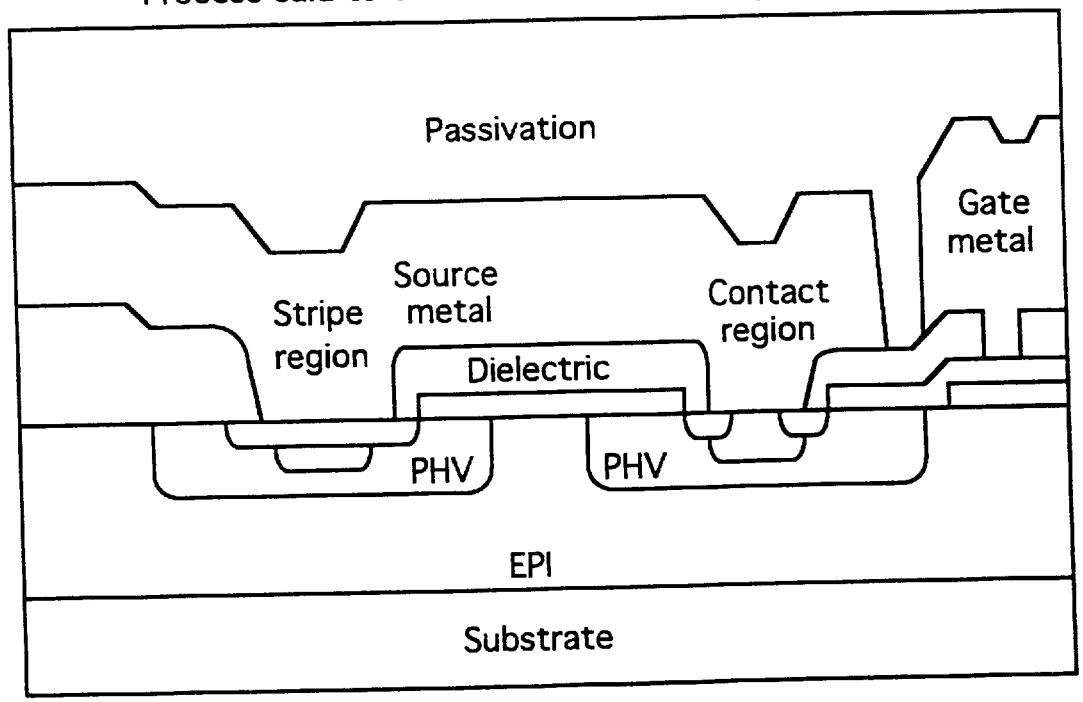
FIG. 2 is a cross sectional view of a prior art MOSFET structure implemented with dielectric layer as spacer to reduce the source width and to improve the device ruggedness.
Figure 3:
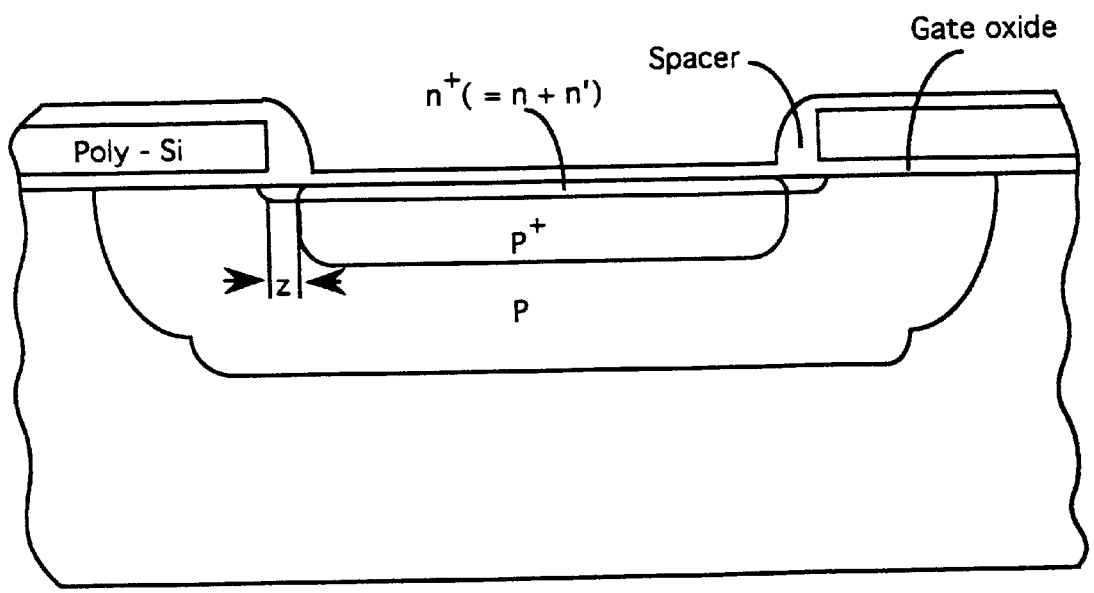
FIG. 3 is a cross-sectional view of another prior art MOSFET structure with a spacer formed by dry etching for implant into a heavily doped body region underneath the source to improve the device ruggedness.
Figure 4A:
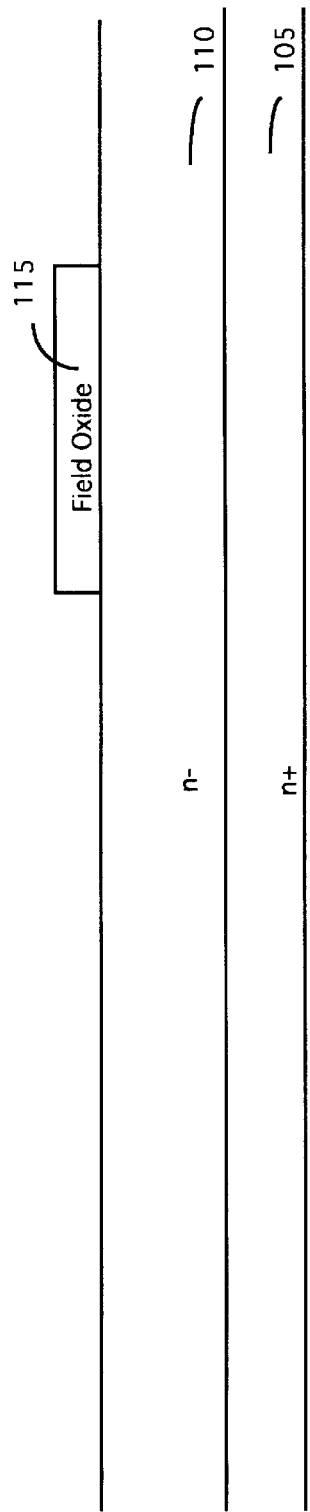
FIGS. 4A to 4D show the processing steps for manufacturing a MOSFET device according to the present invention with a deep heavily doped body-region formed underneath the source region without requiring the use of a spacer.
Figure 4B:
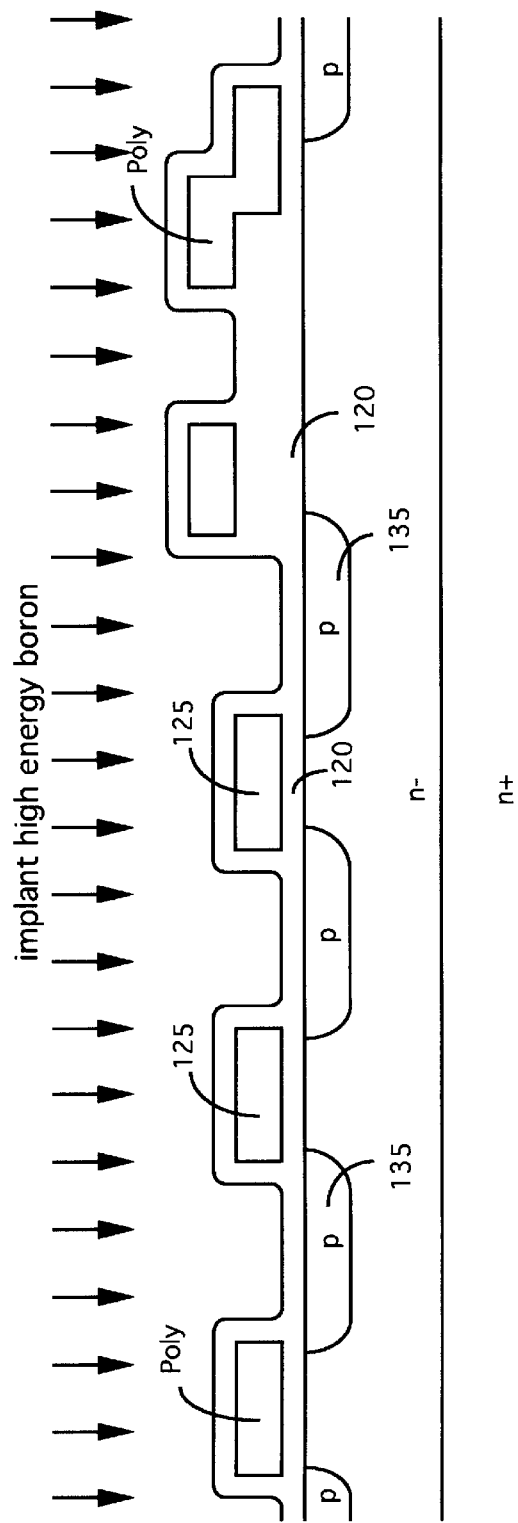

The processing steps for manufacturing a power MOSFET device with improved device ruggedness according to the present invention are illustrated in FIGS. 4A to 4D. As shown in FIG. 4A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about six to eight microns (6–8 $\mu$m). An initial oxide layer 115 of thickness in the range of 5,000 to 10,000 Å is grown which is then etched by applying an mask to define the active areas. Referring to FIG. 4B, a gate oxidation process is first carried out to form a gate oxide layer 120. A polysilicon layer 125 is then deposited on the gate oxide layer 120. A POCL$_3$ doping process is carried out followed by an As-implant process with an ion beam of energy at 60–80 Kev with a flux density of 5 to $8 \times 10^{15}/cm^2$. A poly mask is then applied to carry out the an anisotropic etching process to define the poly gate 125. The resist is stripped then a p-body implant is performed at 30–100 Kev with an ion beam of $3 \times 10^{13}$ to $3 \times 10^{14}/cm^2$ flux density to form the p-body region 135. A p-body diffusion process is then carried out at an elevated temperature of 1,000–1,200° C. for ten minutes to three hours to increase the depth of the p-body region 135 to 1.0–2.0 $\mu$m.

Figure 4C:
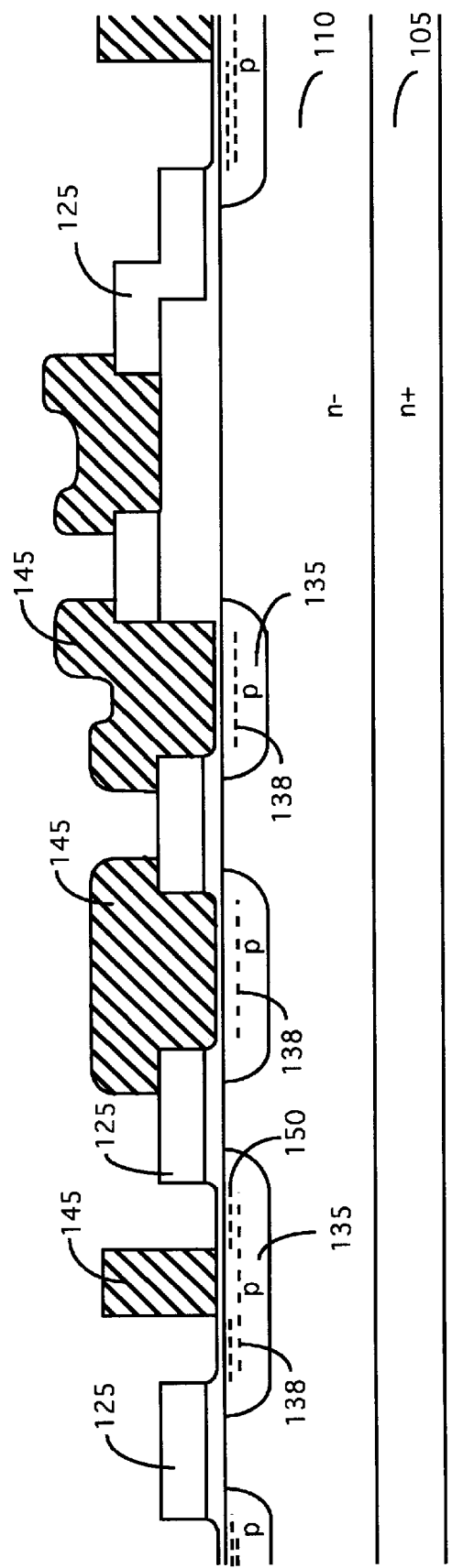
Figure 4D:
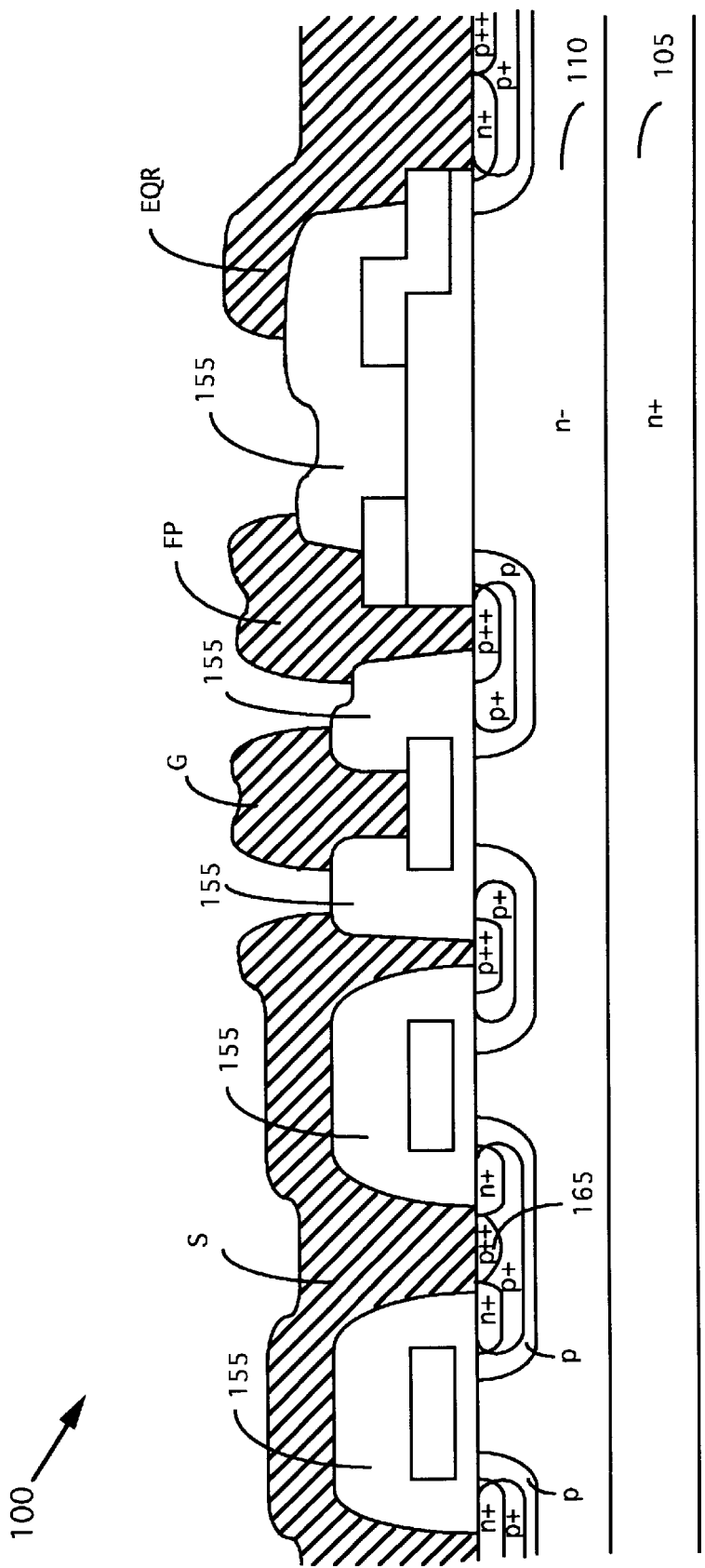

Referring to FIG. 4C, a high energy boron implant with ion flux of $5 \times 10^{13}$ to $1 \times 10^{16}/cm^2$ is carried out with an ion beam at an energy of 100 to 400 Kev to form a deep heavy-doped p+ region 138. The oxide layer which has a thickness of approximate 300 to 2000 Å serves as built-in spacer to block the high energy boron, deeply implanted into the region below the source region, from laterally diffusing into the edge of the p-body regions. An oxide layer etching is then carried out to reduce the thickness of the oxide layer to approximately 200 Å. A N+ block mask 145 is applied for carrying out the N+ implantation, preferably with arsenide ions (As), with an ion beam at an energy of 60–100 Kev and ion flux density of $5 \times 10^{15}$ to $1 \times 10^{16}/cm^2$ to form the N+ region 150. After the resist, i.e., the N+ blocking mask 145, is stripped, the N+ source regions 150 together with the deep p+ region 138 are driven into desired junction depth by a diffusion process. The source regions 150 are driven to a depth ranging from 0.2 to 0.6 $\mu$m and the deep p+ regions 138 are driven below the source regions 150 to a depth ranging from 0.6 to 1.2 $\mu$m underneath the source regions 150. Referring to FIG. 4D, a BPSG or PSG is deposited to form a layer 155 of approximately 5000–15,000 Å in thickness. A BPSG flow or PSG densification process is performed at 900–950° C. for thirty minutes to one hour. A contact mask is applied to perform an etching process to define the contacts. A p+ ion implantation is carried out, with boron at 30–60 Kev having an flux density of $10^{15}$ to $2 \times 10^{15}/cm^2$, to form the p++ region 165 by a p+ activation process at 900–950° C. in an oxidation or inert gas ambient. The final power MOSFET device 100 is completed with the metal deposition and metal etching with a metal mask to define the source contact, the gate contacts, the field plate and equal potential ring (EQR) and since these metal contacts are well known in the art and since they are not the major features of the invention, these metal contacts are not shown for sake of simplicity.

Figure 5:
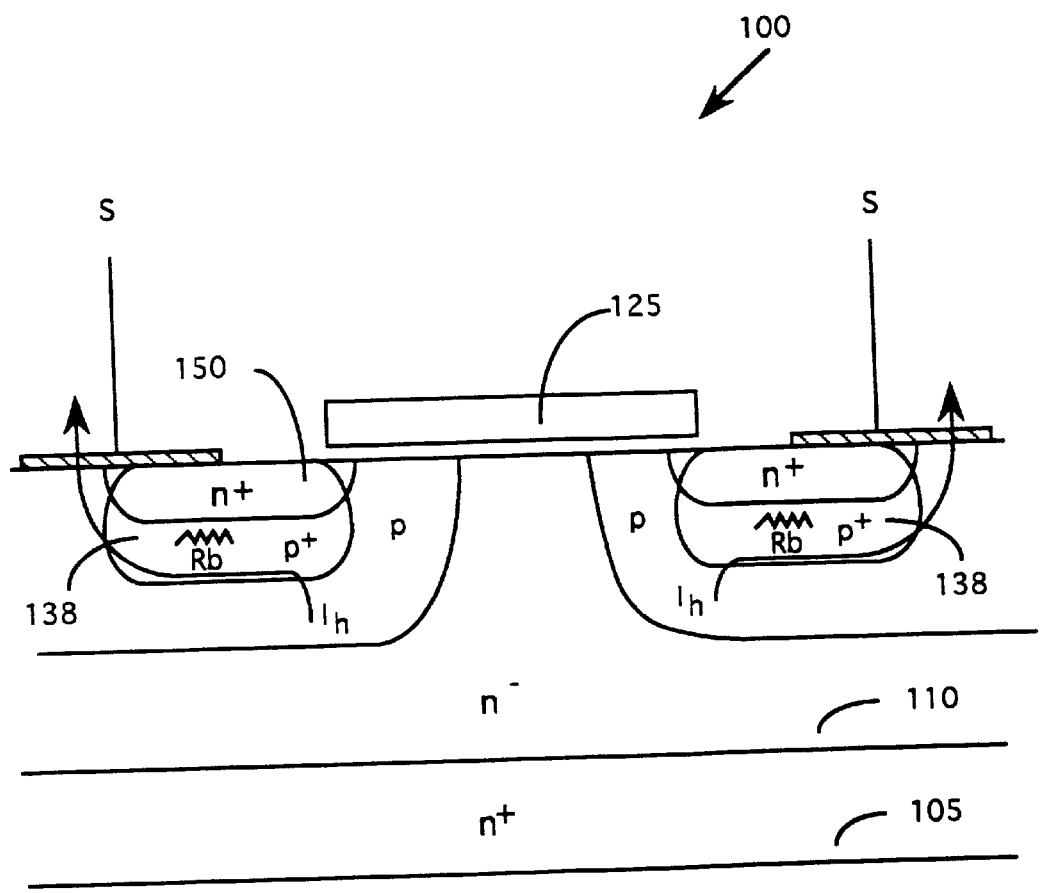
FIG. 5 is a cross-sectional view of a MOSFET device with a deep heavily-doped body region formed underneath the source region manufactured by the processing steps of FIGS. 4A to 4D.
Figure 5A:
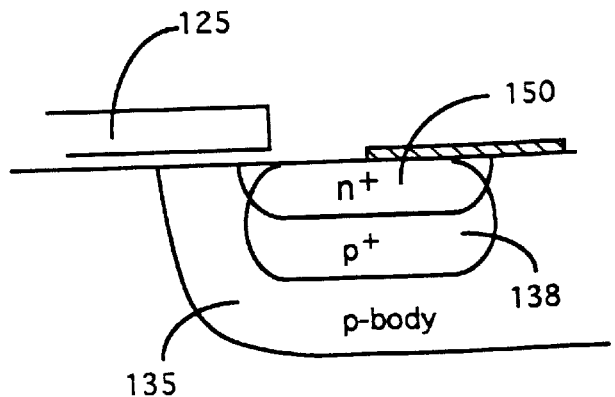
FIG. 5A is a cross-sectional view of a MOSFET device of FIG. 5 to illustrate the relative positions of the body region, the source region and the buried p+ region.

Please refer to FIG. 5, where a cross-sectional view of the n-channel MOSFET device manufactured by the above processing steps is shown. A deep heavily doped p+ region 138, i.e., a buried p+ region, underneath the source region 150 is formed. Unlike the MOSFET transistor as disclosed by Motorola and Laska et al., the deep heavily doped p+ region 138 which is formed below the source region 150 without requiring the use of the spacers. This deep heavily doped p+ region 138 provides the benefit that the resistance over the p-body, i.e., $R_b$, is reduced. During an avalanche breakdown, the voltage generated by the hole current $I_h$ across the parasitic NPN bipolar base region, i.e., $I_hR_b$, is reduced. The probability of an incidental activation of the parasitic bipolar transistor is reduced and the device ruggedness is improved. FIG. 5A shows the relative positions of the p-body region 135, the source region 150 and the buried p+ region 138. The buried p+ region 138 has a depth of approximately 0.8 μm while the source region 150 has a depth of approximately 0.4 μm. The buried p+ region 138, implanted initially with a high energy boron is formed with an initial depth of 0.4 μm. In the high temperature cycles subsequent to the high energy implant, the p+ ions diffuse underneath the source region 150. Because of the initial depth, the p+ ions, are prevented to diffuse to the surface area of the p-body region 135 near the channel. The undesirable effects, when the lateral diffusion causing the boron ions in the buried p+ region 138 to diffuse near the channel thus unduly increasing the threshold voltage, can be prevented by applying the method of this invention without requiring a spacer.

The present invention thus discloses a MOSFET device 100 in a semiconductor chip 105 with a top surface and a bottom surface. The MOSFET device 100 includes a drain region 110, doped with impurities of a first conductivity type, formed in the semiconductor chip 105 near the bottom surface. The MOSFET device further includes a vertical pn-junction region includes a lower-outer body region 135, doped with impurities of a second conductivity type, formed on top of the drain region 110. The pn-junction region further includes a source region 150, doped with impurities of the first conductivity type, formed on top of the lower-outer body region 135 wherein the lower-outer body region 135 forming a channel region extending from the source region 150 to the drain region 110 near the top surface. The MOSFET device further includes a gate 125 formed on top of the channel region on the top surface, the gate 125 includes a thin insulative bottom layer for insulating from the channel region, the gate 125 is provided for applying a voltage thereon for controlling a current flowing from the source region 150 to the drain region 110 via the channel region. The MOSFET device further includes a deep heavily-doped body-dopant region 138 disposed immediately below the source region 150 in the lower-outer body region 135 implanted with a higher concentration of dopant than the lower-outer body region 135 whereby a device ruggedness of the MOSFET device 100 is improved. In a preferred embodiment, the gate 125 formed on top of the channel region on the top surface including a polysilicon layer having a thickness ranging from 0.5 to about 1.2 μm suitable for blocking an implant ion beam for implating the deep heavily-doped body-dopant region 138.

Furthermore, the present invention discloses an improved method for fabricating a MOSFET transistor 100 on a substrate 105 to improve a device ruggedness. The method includes the steps of: (a) forming an epi-layer 110 of a first conductivity type as a drain region on the substrate 105 and then growing an initial oxide layer over the epi-layer; (b) applying an active layer for etching the initial oxide layer to define an active area and forming a gate oxide layer 120 thereon followed by depositing an overlaying polysilicon layer 125; (c) applying a poly mask for etching the polysilicon layer to define a plurality of poly gates 125; (d) removing the poly mask for carrying out a body implant of a second conductivity type followed by performing a body diffusion for forming a plurality of body regions 135 and for growing a spacing oxide layer overlaying the ploy gates 125; (e) implanting high energy body-dopants of the second conductivity type to form a deep heavily-doped body-dopant region 138 in each of the body regions 135 followed by etching the spacing oxide layer and applying a source blocking mask 145 for implanting a plurality of source regions 150 in the body regions with ions of the first conductivity type followed by removing the source blocking mask 145; and (f) regrowing the oxide and forming an insulation layer 155 and applying a high temperature process for densification of the insulation layer 155 and further for actuating a diffusion of the source regions 150 and the deep heavily-doped body-dopant regions 138 wherein the deep heavily-doped body-dopant regions 138 are formed immediately below the source regions 150 whereby the device ruggedness is improved. In a preferred embodiment, the step of forming a gate oxide layer 115 followed by depositing an overlaying polysilicon layer 125 in step (b) is a step of forming the polysilicon layer 125 of thickness ranging from 0.5 to 1.2 μm. Also, the step of implanting high energy body-dopants of the second conductivity type to form a deep heavily-doped body-dopant region 138 in each of the body regions 135 in step (e) is a step of forming the deep heavily-doped body-dopant regions 138 with narrower width in the body regions 135 wherein the poly gates 125 having a thickness ranging from 0.5 to 1.2 μm blocking the high energy body-dopants and the spacing oxide layer limiting a width of implanting of the high energy body-dopants implanted into the body regions 135.

Figure 6A:
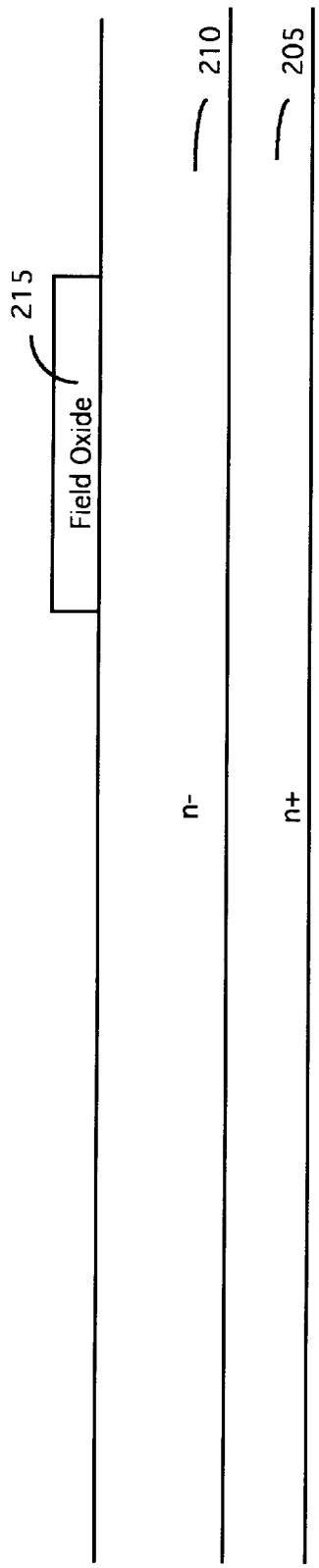
FIGS. 6A to 6D show alternate preferred processing steps for manufacturing a MOSFET device according to the present invention for forming the deep heavily-doped body-region underneath the source region for device ruggedness improvement without requiring the use of spacer.
Figure 6B:
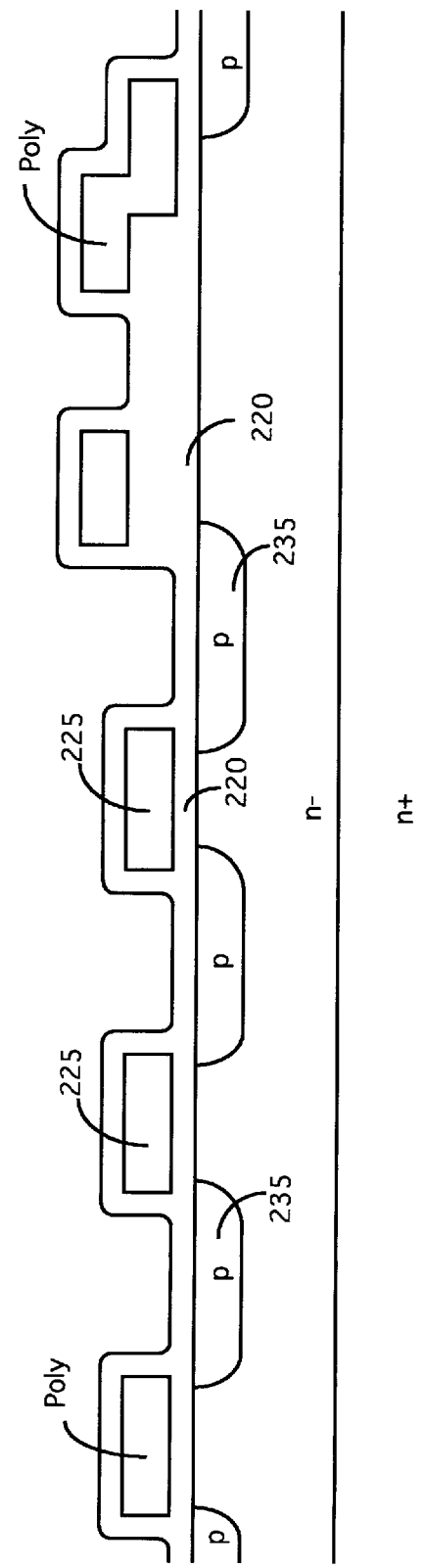

Another method to form a MOSFET device 200 with improved device ruggedness according to the present invention without requiring the use of a separate spacer applies slightly different processing steps of manufacture as that illustrated in FIGS. 6A to 6D. As shown in FIG. 6A, the processing steps begins by first growing a N epitaxial layer 210 with a resistivity ranging from 0.1 to 1.0 ohm-cm on top of a N+ substrate 205. The substrate has a resistivity of 0.001 to 0.007 ohm-cm. The thickness and the resistivity of the epitaxial layer 210 depend on the device requirements for the on-resistance and breakdown voltage. In a preferred embodiment, the thickness of the epi-layer 210 is about six to eight microns (6–8 μm). An initial oxide layer 215 of thickness in the range of 5,000 to 10,000 Å is grown which is then etched by applying an mask to define the active areas. Referring to FIG. 6B, a gate oxidation process is first carried out to form a gate oxide layer 220. A polysilicon layer 225 is then deposited on the gate oxide layer 220. The polysilicon gate layer 225 is formed with slightly greater thickness ranging from 0.5 to 1.2 micro-meters. A $POCL_3$ doping process is carried out followed by an As-implant process with an ion beam of energy at 60–80 Kev with a flux density of 5 to $8\times10^{15}/cm^2$. A poly mask is then applied to carry out the an anisotropic etching process to define the poly gate 225. The resist is stripped and a p-body implant at 30–100 Kev with an ion beam of $3\times10^{13}$ to $3\times10^{14}/cm^2$ flux density is carried out to form the p-body region 235. A p-body diffusion process is then carried out at an elevated temperature of 1,000–1,200° C. for ten minutes to three hours to increase the depth of the p-body region 235 to 1.0–2.0 μm.

Figure 6C:
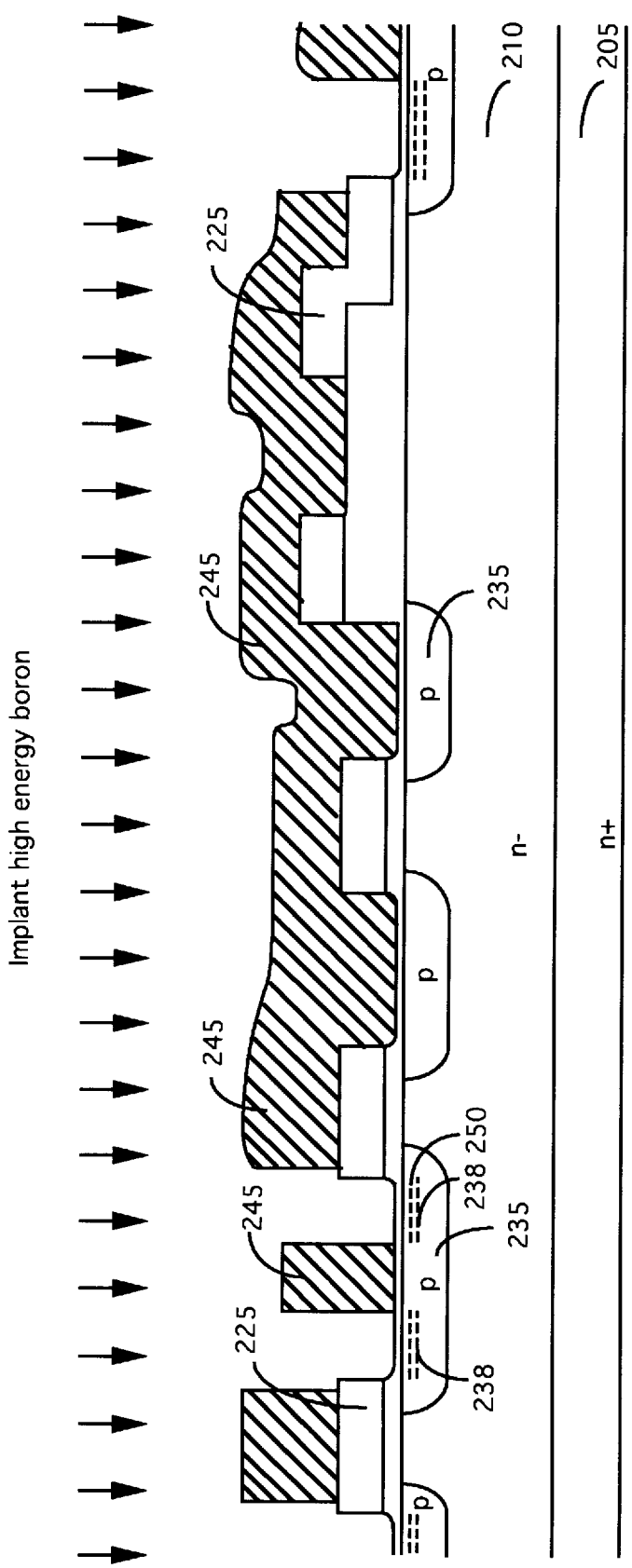
Figure 6D:
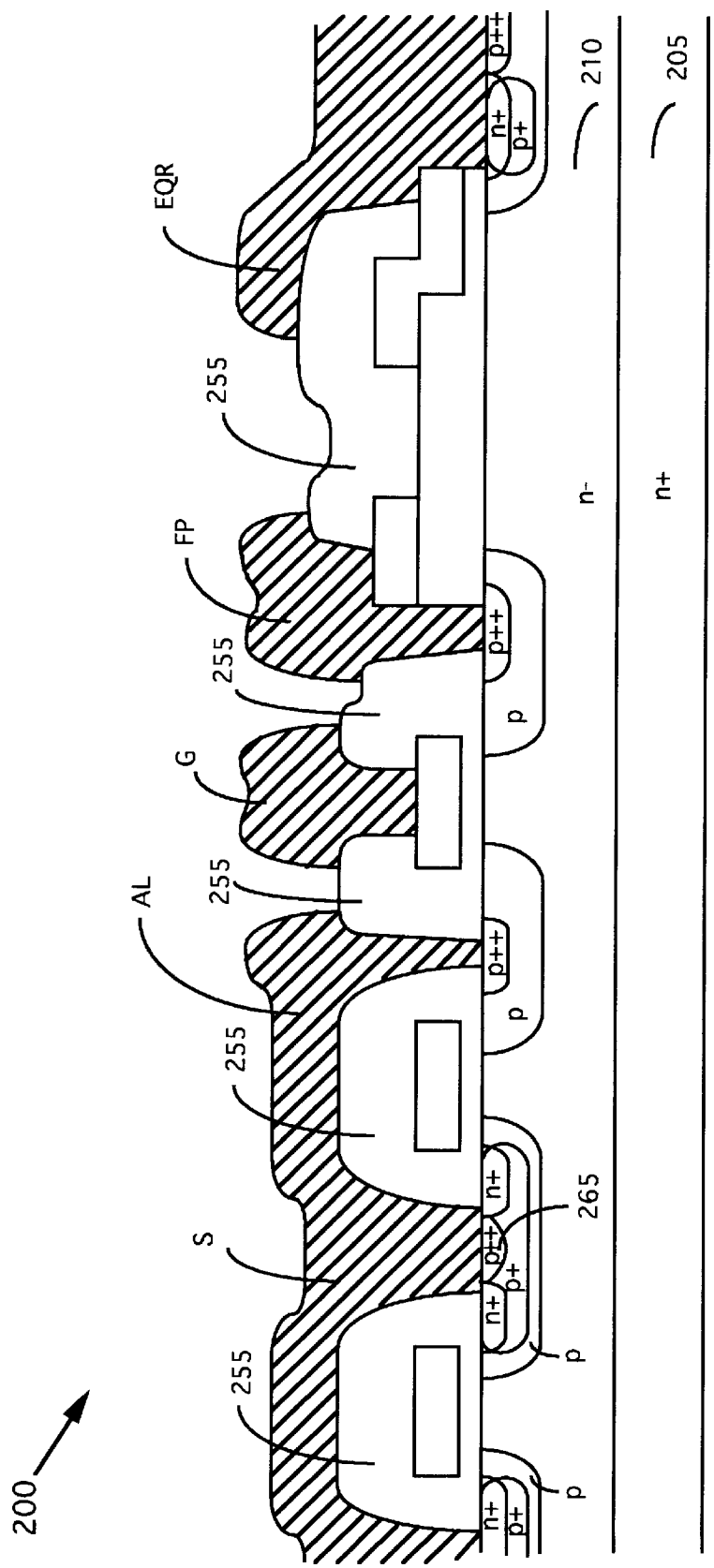

Referring to FIG. 6C, an oxide layer etching is first carried out to reduce the thickness of the oxide layer to approximately 200 Å. A N+ block mask 245 is applied where the N+ blocking mask 245 is also formed on top of the polysilicon gate 225. Before the N+ source implant is performed, a high energy boron implant with ion flux of $5\times10^{13}$ to $1\times10^{16}/cm^2$ is carried out with an ion beam at an energy of 100 to 400 Kev. A deep p+ region 238 is formed which is formed at a depth of approximately 0.4–0.6 µm beneath the surface. The N+ implantation is then carried out, preferably with arsenide ions (As), with an ion beam at an energy of 60–100 Kev and ion flux density of $5\times10^{15}$ to $1\times10^{16}/cm^2$ to form the N+ region 250. After the resist, i.e., the N+ blocking mask 245, is stripped, the N+ source regions 250 together with the deep p+ region 238 are driven into desired junction depth by a diffusion process. The source regions 250 are driven to a depth ranging from 0.2 to 0.6 µm and the deep p+ regions 238 are driven below the source regions 250 to a depth ranging from 0.6 to 1.2 µm underneath the source regions 250. Subsequent processing steps to complete the manufacture of the MOSFET device as that shown in FIGS. 6D, are similar to that shown in FIG. 4D. A BPSG or PSG is deposited to form a layer 255 of approximately 5000–15,000 Å in thickness. A BPSG flow or PSG densification process is performed at 900–950° C. for thirty minutes to one hour. A contact mask is applied to perform an etching process to define the contacts 260. A p+ ion implantation is carried out, with boron at 30–60 Kev having an flux density of $10^{15}$ to $2\times10^{15}/cm^2$, to form the p+ region 265 by a p+ activation process at 900–950° C. in an oxidation or inert gas ambient. The final power MOSFET device 200 is completed with the metal deposition and metal etching with a metal mask to define the source contact, the gate contacts, the field plate and equal potential ring (EQR).

Thus, the present invention further discloses an improved method for fabricating a MOSFET transistor 200 on a substrate 205 to improve a device ruggedness. The method of fabrication includes the steps of (a) forming an epi-layer 210 of a first conductivity type as a drain region on the substrate 205 and then growing an initial oxide layer over the epi-layer 210; (b) applying an active layer for etching the initial oxide layer to define an active area and forming a gate oxide 215 layer thereon followed by depositing an overlaying polysilicon layer 225; (c) applying a poly mask for etching the polysilicon layer 225 to define a plurality of poly gates 225; (d) removing the poly mask for carrying out a body implant of a second conductivity type followed by performing a body diffusion for forming a plurality of body regions 235; (e) applying a source blocking mask 245 for blocking a plurality of source regions 250 and each of the poly gates 225 followed by implanting high energy body-dopants of the second conductivity type to form a deep heavily-doped body-dopant region 238 in each of the body regions; and (f) implanting a plurality of source regions 250 in the body regions 235 with ions of the first conductivity type followed by removing the source blocking mask 245; and (g) forming an insulation layer 255 and applying a high temperature process for densification of the insulation layer 225 and further for actuating a diffusion of the source regions 250 and the deep heavily-doped body-dopant regions 238 wherein the deep heavily-doped body-dopant regions 238 are formed immediately below the source regions 250 whereby the device ruggedness is improved.

Therefore, improved MOSFET structures, and fabrication processes are provided in the present invention to overcome the difficulties and limitations encountered in the prior art. Specifically, an improved MOSFET fabrication process and cell structure are provided wherein a deep heavily doped body-dopant region is formed underneath the source regions for device ruggedness improvement without requiring the use of a spacer such that the fabrication processes are simplified. By employing the simplified MOSFET fabrication process to produce an improved cell structure with a deep heavily doped body-dopant region formed underneath the source regions for device ruggedness improvement without requiring the use of a spacer, cost savings for device production are also achieved.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A MOSFET device in a semiconductor chip with a top surface and a bottom surface, said device comprising:
   a drain region, doped with impurities of a first conductivity type, formed in said semiconductor chip near said bottom surface;
   a vertical pn-junction region includes a lower-outer body region, doped with impurities of a second conductivity type, formed on top of said drain region;
   said pn-junction region further includes a source region, doped with impurities of said first conductivity type, formed on top of said lower-outer body region wherein said lower-outer body region defining a channel region extending from said source region to said drain region near said top surface;
   a gate formed on top of said channel region on said top surface, said gate includes a thin insulative bottom layer for insulating from said channel region, said gate is provided for applying a voltage thereon for controlling a current flowing from said source region to said drain region via said channel region; and a deep heavily-doped body-dopant region disposed immediately below said source region in said lower-outer body region implanted with a higher concentration of dopant than said lower-outer body region whereby a device ruggedness of said MOSFET device is improved, and said deep heavily-doped body-dopant region having a body-dopant concentration profile defined by a diffusion of said body-dopant laterally diffused to substantially a same lateral distance under said gate as said source region maintaining a distance away from a region below said channel region.

2. The MOSFET device as recited in claim 1 wherein:
   said impurities of said first conductivity-type is a n-type conductivity for constituting a n-channel MOSFET.

3. The MOSFET device as recited in claim 2 wherein:
   said deep heavily-doped body-dopant region disposed immediately below said source region is a region including a higher concentration of boron ions than said lower-outer body.

4. The MOSFET device as recited in claim 3 wherein:
   said source region doped with said impurities of said first conductivity type includes impurities of arsenide ions.

5. The MOSFET device as recited in claim 1 wherein:
   said gate formed on top of said channel region on said top surface including a polysilicon layer having a thickness ranging from 0.5 to 1.2 µm suitable for blocking an ion beam for implanting said deep heavily-doped body-dopant region disposed immediately below said source region.

6. A MOSFET device in a semiconductor chip with a top surface and a bottom surface, said device comprising:

a drain region, doped with impurities of a first conductivity type, formed in said semiconductor chip near said bottom surface;

a vertical pn-junction region includes a lower-outer body region, doped with impurities of a second conductivity type, formed on top of said drain region;

said pn-junction region further includes a source region, doped with impurities of said first conductivity type, formed on top of said lower-outer body region wherein said lower-outer body region defining a channel region extending from said source region to said drain region near said top surface;

a gate formed on top of said channel region on said top surface, said gate includes a thin insulative bottom layer for insulating from said channel region, said gate is provided for applying a voltage thereon for controlling a current flowing from said source region to said drain region via said channel region; and a deep heavily-doped body-dopant region disposed immediately below said source region in said lower-outer body region implanted with a higher concentration of dopant than said lower-outer body region whereby a device ruggedness of said MOSFET device is improved, and said deep heavily-doped body-dopant region having a body-dopant concentration profile defined by a diffusion of said body-dopant from an implant depth about 0.4 to 0.6 micrometers about twice as that of a source implant-depth laterally diffused to substantially a same lateral distance under said gate as said source region maintaining a distance away from a region below said channel region.

* * * * *